(12) United States Patent
Brown et al.

(10) Patent No.: US 6,469,911 B1
(45) Date of Patent: Oct. 22, 2002

(54) SOLAR SHIELD FOR ELECTRONIC DEVICES

(75) Inventors: Stephen Robert Brown, Derry, NH (US); Glen Brian Rochford, Pelham, NH (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 09/956,675

(22) Filed: Sep. 20, 2001

(51) Int. Cl.[7] .............................. H05K 9/00; H05K 7/14; G21F 3/00
(52) U.S. Cl. ...................... 361/816; 361/800; 361/818; 250/515.1; 343/841; 174/35 R
(58) Field of Search ................................. 361/800, 816, 361/818; 439/607; 330/68; 333/12; 334/85; 343/841; 315/85; 307/91; 174/35 R

(56) References Cited

U.S. PATENT DOCUMENTS 5,920,827 A * 7/1999 Baer et al. ...................... 702/3
5,986,618 A * 11/1999 Aakalu et al. .............. 343/872

* cited by examiner

*Primary Examiner*—Randy W. Gibson
*Assistant Examiner*—Dameon E. Levi

(57) ABSTRACT

A unique solar shield and a solar-ray shielding method are disclosed. The solar shield of the present invention is divided essentially into two parts—a wrapping member and a mounting plate. The wrapping member wraps around an electronic device. The mounting plate holds the wrapping member around the electronic device. The electronic device is fixedly attached to the mounting plate using known fasteners such as bolts. The solar shield shields the electronic device from solar rays and prevents unwanted heat absorption due to the solar rays.

23 Claims, 4 Drawing Sheets

SOLAR SHIELD FOR ELECTRONIC DEVICES

FIELD OF THE INVENTION

The present invention relates to shields for electronic devices and, more particularly, to a unique solar shield for shielding electronic devices from solar rays.

BACKGROUND OF THE INVENTION

Electronic devices, such as transmitters and receivers, that are situated outdoors may require shielding from solar rays to avoid overheating and interference with their operation. A variety of different solar-ray shielding techniques are known in the art. In one conventional technique, the electronic devices are painted with white paint to reduce the absorption of solar rays. In another conventional technique, the shapes of the electronic devices are designed to minimize surface areas exposed to solar rays. In still another conventional technique, heat sinks are incorporated into the electronic devices.

Despite these approaches, a variety of problems with solar ray shielding for electronic devices persist. For instance, the use of white paint compromises the aesthetics of the electronic device (i.e., gets dirty) and may need to be reapplied often depending on the geographical location of the electronic devices. With respect to configuring the electronic device to minimize exposure to solar-rays, this technique often complicates the design and shape of the electronic device and may result in a structure less optimal for performing the desired electrical operations. With respect to using heat sinks, this technique increases the cost associated with the electronic device and enlarges its size.

Accordingly, there is a need for an improved method and device for shielding solar rays from electronic devices that overcomes the above-described and other problems associated with conventional solar shielding devices and methods.

SUMMARY OF THE INVENTION

The present invention provides a unique solar shield and a solar-ray shielding method that overcomes the problems of conventional solar shielding devices and methods.

In a preferred embodiment, the solar shield comprise a wrapping member and a mounting plate. The wrapping member has sections that are folded or bent to wrap around an electronic device. The mounting plate fixedly holds the wrapping member in a folded state around the electronic device. The electronic device also is fixedly attached to the mounting plate using fasteners such as bolts or brackets.

The solar shield configuration minimizes the heat transfer from the shield into the electronics by creating a lengthy path where the heat will dissipate off the shield prior to reading the electronics region.

The solar shield of the present invention is simple in design, easy to manufacture, easy to assemble, and refined in appearance. At the same time, the solar shield effectively shields the electronic device from unwanted temperature rises due to impinging solar rays.

DETAILED DESCRIPTION OF THE PREFERRED EMBODIMENTS

Figure 1A:
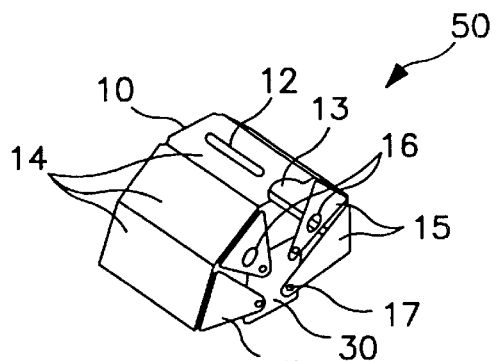
FIGS. 1A and 1B are different perspectives of a solar shield according to one embodiment of the present invention.

As shown in FIGS. 1A–2D, the solar shield 50 essentially comprises two parts-a wrapping member 10 and a mounting plate 30. The wrapping member 10 includes a plurality of first wrapping sections 14 connected to each other, and a plurality of second wrapping sections 15 extending from the first wrapping sections 14. The end portions of the second wrapping sections 15 are fixed to the mounting plate 30 using known fastening techniques such as spot welding. Each of the wrapping member 10 and the mounting plate 30 comprises a material capable of shielding solar rays. The term "shielding", as used here, broadly refers to reflecting, absorbing, and deflecting. Suitable materials include aluminum, steel and other sheet metals, and plastics, such as ABS and polycarbonate.

The wrapping member 10 further includes an air hole 12 for exhausting any hot air or gas within the solar shield 50, and a pole hole 13 (optional) through which a pole for supporting the electronic device can pass. The air hole 12 and the pole hole 13 preferably are both disposed in one of the first wrapping sections 14 that will face upwardly when the assembly is mounted. The pole hole 13 (formed by carving out a side portion of a wrapping section 14) is advantageous because it allows the solar shield 50 to be mounted on a pole at different angles. At one or more of the second wrapping sections 15, a connector hole 16 is provided through which cables or other connectors can pass.

Figure 3A:
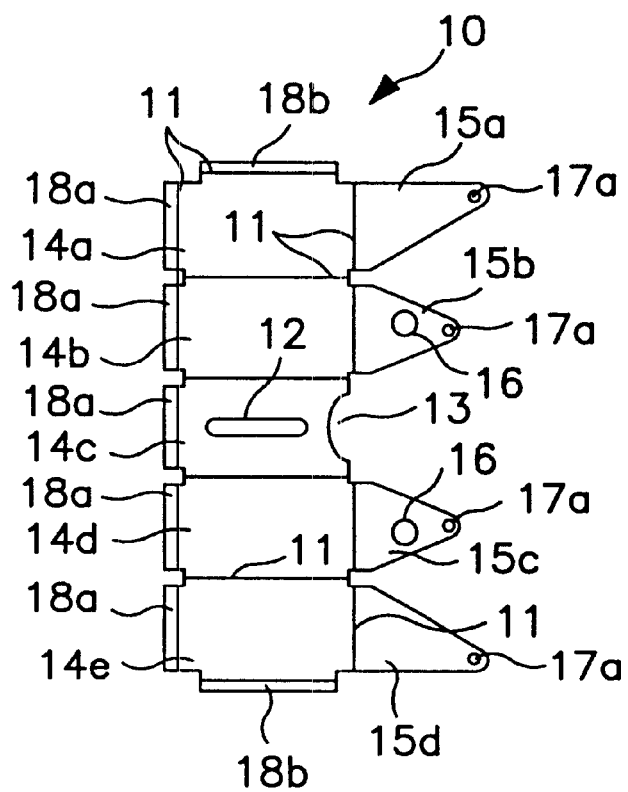
FIG. 3A is an unfolded, flattened lay out view of a wrapping member of the solar shield shown in FIG. 1A.

FIG. 3A is a layout view of the wrapping member 10 of the solar shield 50 according to one embodiment of the present invention. As shown in FIG. 3A, the wrapping member 10 includes five first wrapping sections 14 (14a, 14b, 14c, 14d and 14e), and four second wrapping sections 15 (15a, 15b, 15c and 15d) extending from the first sections 14a, 14b, 14d and 14e. The first and second wrapping sections 14 and 15 meet each other along folding lines 11. Each of the second wrapping sections 15a–15d includes a mounting hole 17a (e.g., for accepting a bolt) that align with the holes 17b in the mounting plate 30. Each of the two inner second wrapping sections 15b and 15c includes a connector hole 16 for allowing the cable or other connector of the electronic device to pass through.

The wrapping member 10 further includes a plurality of first reinforcement extensions 18a extending from the first wrapping sections 14a–14e oppositely from the second wrapping sections, and a pair of second reinforcement extensions 18b extending from the first wrapping sections 14a and 14e in a direction substantially perpendicular to the first reinforcement extensions. These first and second reinforcement extensions 18a and 18b are foldable towards the first wrapping sections 14a–14e by the operation of the folding lines 11 (e.g., as shown in FIG. 1B). This reinforces or strengthens the end portions of the first wrapping sections 14 against wind, rain, snow and other weathering factors.

Figure 1B:
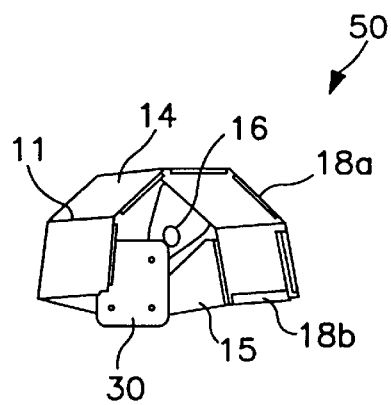
Figure 2A:
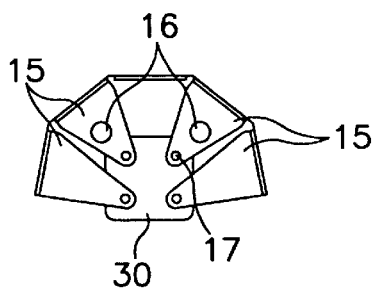
FIG. 2A is a front view of the solar shield shown in FIG. 1A.
Figure 2B:
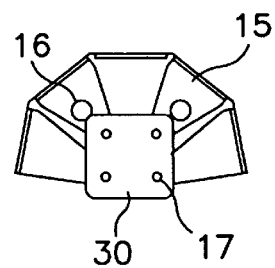
FIG. 2B is a back view of the solar shield shown in FIG. 1A.
Figure 2C:
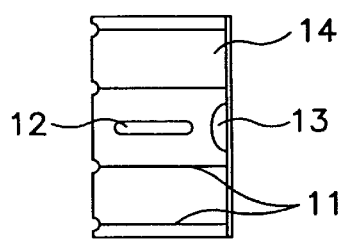
FIG. 2C is a top plan view of the solar as shown in FIG. 1A.
Figure 2D:
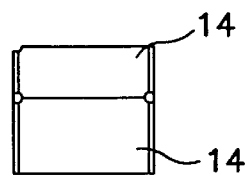
FIG. 2D is a side view of the solar shield as shown in FIG. 1A.
Figure 3B:
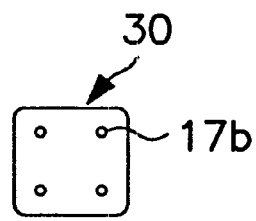
FIG. 3B is a plan view of a mounting plate of the solar shield shown in FIG. 1A.

FIG. 3B is a plan view of the mounting plate 30 in FIG. 1A. The mounting plate 30 includes a plurality of mounting holes 17b (e.g., for accepting bolts) corresponding to the holes 17a in FIG. 3A for attaching the second wrapping sections 15 and the electronic device to the mounting plate 30. The mounting plate 30 in this example has a configuration of a square with rounded ends. However, any other shape, size or configuration can be used as long as the mounting plate 30 is able to hold together the ends of the second wrapping sections 15a–15d as well as the electronic device.

The wrapping member 10 of the solar shield 50 is folded along the folding lines 11 (e.g., as shown in FIG. 3A) so that it wraps around the electronic device. Because of the folding lines, the solar shield of the present invention can be easily assembled. Further, since the solar shield is comprised of the wrapping member and the mounting plate, it can be manufactured easily and in a cost effective manner.

Figure 4:
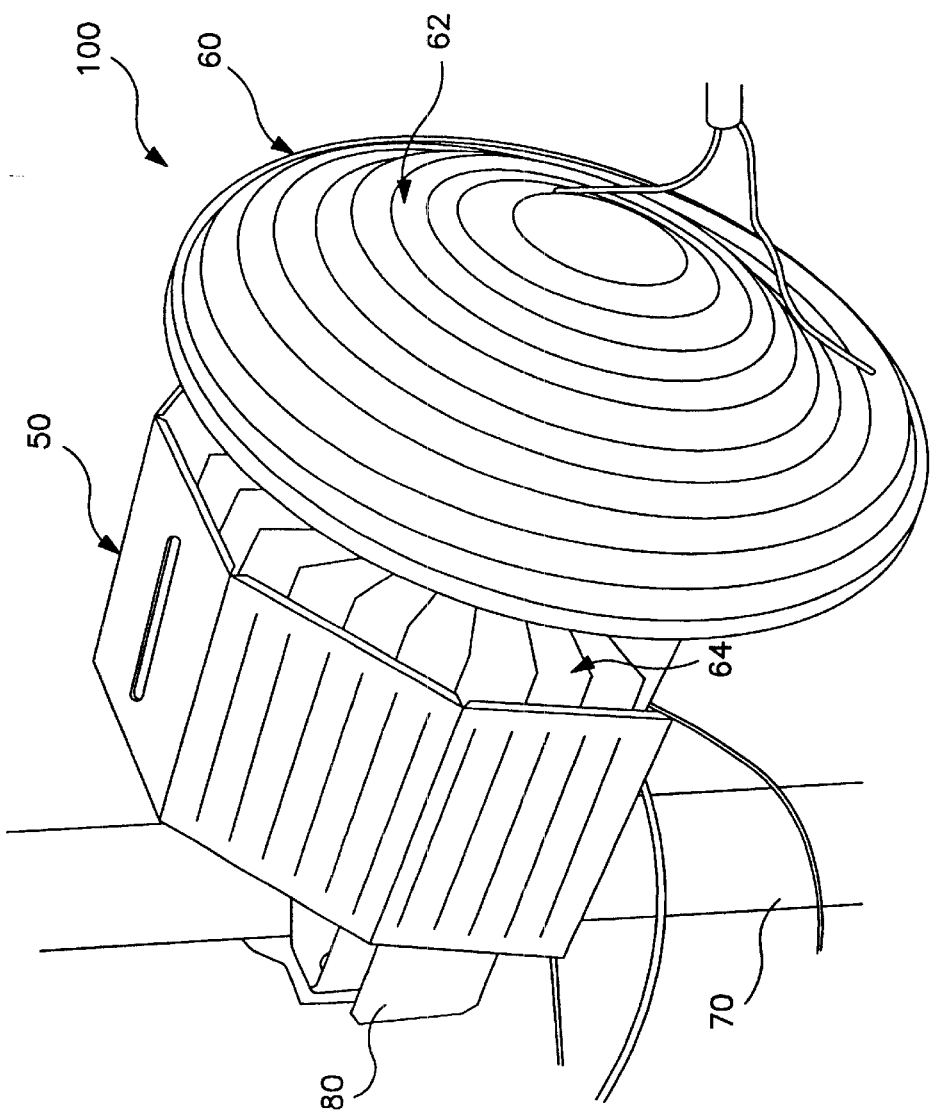
FIG. 4 is a pictorial representation of the solar shield of FIG. 1A wrapped around an electronic device and mounted on a pole according to the present invention.
Figure 5:
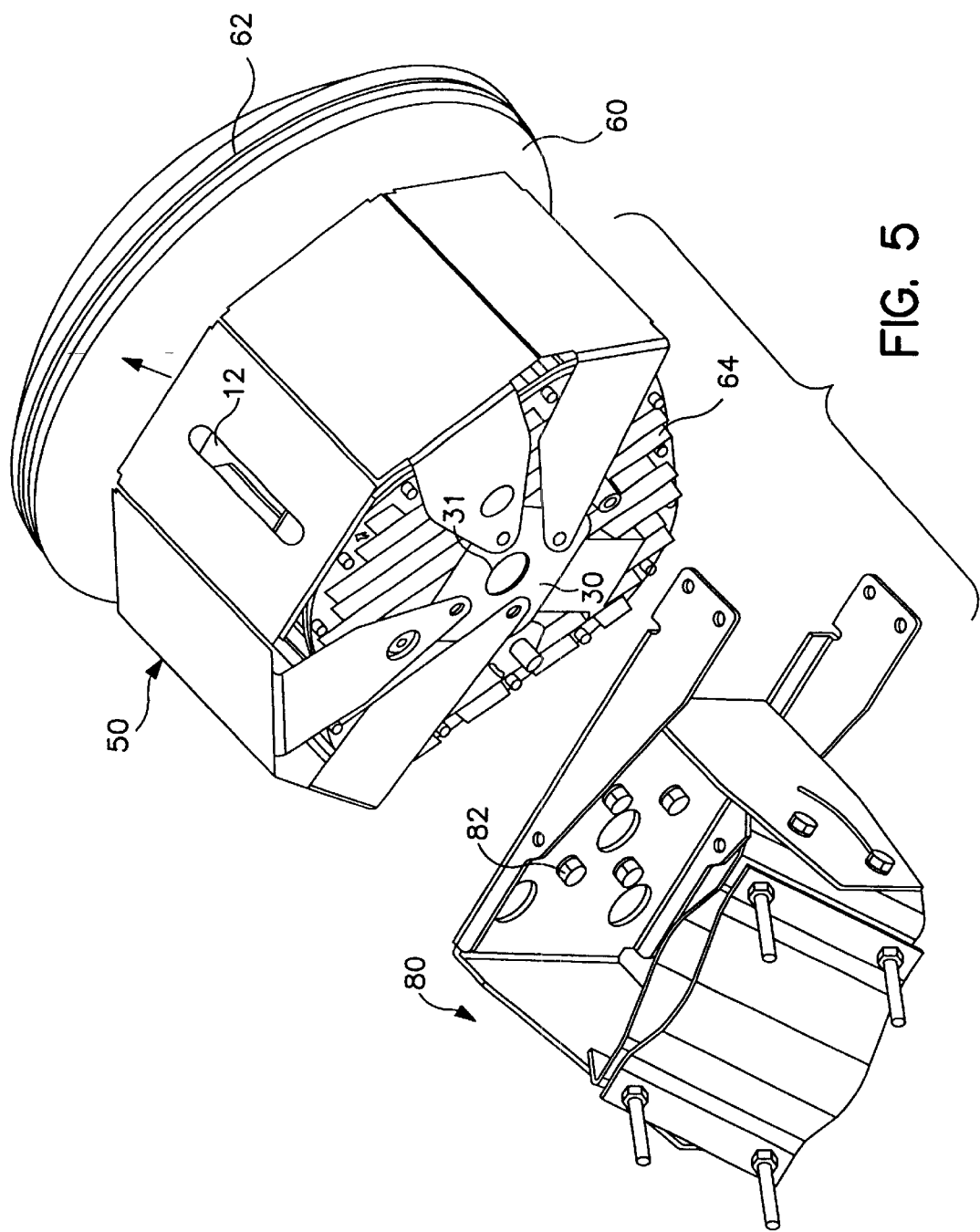
FIG. 5 is a perspective view of a pole bracket and the solar shield of FIG. 1A wrapped around an electronic device according to the present invention.

FIG. 4 is a pictorial representation of the solar shield 50 used in conjunction with an electronic device and FIG. 5 is a perspective view of the solar shield 50 bolted to the electronic device, and a pole bracket for mounting the solar shield 50 to a pole, all according to one embodiment of the present invention. These figures are provided only to illustrate the use of the solar shield in conjunction with an electronic device and a pole bracket. Obviously, any other electronic device and/or pole bracket can be used in lieu of those shown in FIGS. 4 and 5.

As shown in FIGS. 4 and 5, an electronic device, comprising electronic portion 64 and antenna/radome 62 in need of a solar-ray shielding is fixedly attached to the metal plate 30 of the solar shield 50 so that the solar shield 50 wraps around electronic portions 64 of the electronic device 60 but not around an antenna/radome 62 of the electronic device 60. A plastic solar shield could be placed above the antenna, if so desired. The solar shield 50 and the electronic device 60 are fixedly mounted on a particular location of a pole 70 Using a conventional fastener such as pole bracket 80, which is well known in the art, Bolts 82 (FIG. 5) or other fasteners can be used to fix the solar shield 50 to the pole bracket 80. In this example, a pole hole 13 is not provided in the solar shield 50 since the solar shield 50 is mounted on the pole 70 at a downward angle.

The electronic device 60 is protected or shielded from solar rays because the solar shield 50 wraps around the electronic portions 64 of the solar shield 50. Any air or gas entrapped between the electronic portions 64 and the inside of the solar shield 50 can be exhausted through the air hole 12 to assist with cooling the electronic device 60.

One skilled in the art will readily understand that one or more air holes such as the air hole 12 can be provided on each of the first and second wrapping sections 14 and 15. Further, connector holes such as the connector hole 16 can be provided at any portion of the solar shield 50 if such holes are needed and appropriate to combine the electronic device with the solar shield 50. For example, a connector hole 31 (FIG. 5) can be provided at the center of the mounting plate 30, if needed. Any shape, size or configuration can be used for the air holes and/or connector holes. Further, the shape, size and configuration of the solar shield or different parts of the solar shield of the present invention can be varied depending on the application and need without departing from the spirit and scope of the invention. For example, instead of having five first wrapping sections 14a–14e, there can be a different number of first wrapping sections such as three first wrapping sections. In this case, the three first wrapping sections will be folded to form a rectangular shape and there can be three second wrapping sections corresponding to the three first wrapping sections. The shape, size and configuration of the solar shield or different parts thereof can also vary depending on the shape, size or configuration of the electronic device to be shielded. All such variations are contemplated as part of the present invention.

In another embodiment, instead of having multiple first wrapping sections that are configured to wrap around an electronic device by the operation of the folding lines, one continuous and smooth wrapping section in the shape of a semicircle can be used in lieu of the first wrapping sections 14a–14e.

The solar shield of the present invention is applicable to any device that requires shielding from solar rays, such as transmitters, receivers, LMDS (Local Multi-point Distribution System) products, etc.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A device for shielding solar rays from an electronic device, comprising:
    a wrapping member for wrapping at least a portion of the electronic device; and
    a mounting plate for holding the wrapping member around the electronic device and fixing the electronic device to the shielding device.

2. The device of claim 1, wherein the wrapping member includes:
    a plurality of first wrapping sections; and
    a plurality of second wrapping sections each extending from one of the first wrapping sections.

3. The device of claim 2 wherein the plurality of first wrapping sections are each foldably connected to an adjacent one of the first wrapping section along a folding line.

4. The device of claim 3, wherein the first and second wrapping sections are foldably connected to each other along folding lines.

5. The device of claim 4 wherein the folding lines connecting s aid plurality of first wrapping sections to each other are perpendicular to the folding lines connecting said plurality of first wrapping section to said plurality of second wrapping sections.

6. The device of claim 5, wherein the second wrapping sections are fixedly mounted to the mounting plate.

7. The device of claim 4, wherein at least one of the first wrapping sections includes an air hole for exhausting air from around an electronic device disposed within the shielding device.

8. The device of claim 7, wherein said one of the first wrapping sections further includes a pole hole for allowing a pole to pass through.

9. The device of claim 4, wherein at least one of the second wrapping sections includes a hole for allowing a connector of the electronic device to pass through.

10. The device of claim 5, wherein the wrapping member further includes a plurality of first reinforcement extensions extending from the first wrapping sections in a first direction.

11. The device of claim 10 wherein the first direction is parallel to said folding lines connecting said plurality of first wrapping sections to each other.

12. The device of claim 11, wherein the wrapping member further includes a plurality of second reinforcement extensions extending from at least one of the first wrapping sections in a second direction.

13. The device of claim 11, wherein the wrapping member further includes a plurality of second reinforcement extensions extending from at least one of the first wrapping sections in a second direction perpendicular to the first direction.

14. The device of claim 6 wherein said plurality of second wrapping sections are folded approximately perpendicular to said plurality of first folding sections.

15. The device of claim 4, wherein at least one of the wrapping member and the mounting plate is formed of metal.

16. The device of claim 4, wherein at least one of the wrapping member and the mounting plate is formed of plastic.

17. The device of claim 4, wherein the mounting plate includes a hole for receiving a connector therethrough.

18. The device of claim 4, wherein the electronic device is selected from a group compromising a transmitter, a receiver, and a LMDS (Local Multipoint Distribution System) device.

19. The device of claim 2, wherein each of the first wrapping sections is rectangular and each of the second wrapping sections is triangular.

20. The device of claim 5, wherein each of the first wrapping sections is rectangular, and each of the second wrapping sections is triangular.

21. A method for shielding solar rays from an electronic device suing a solar shield including a wrapping member and a mounting plate, the method comprising the steps of:
   wrapping the wrapping member of the solar shield around at least a portion of the electronic device; and
   fixedly connecting the electronic device and portions of the wrapping member to the mounting plate to shield the electronic device from solar rays.

22. The method of claim 21, wherein the wrapping member include a plurality of first wrapping sections, and a plurality of second wrapping sections extending from the first wrapping sections, and
   wherein the connecting step includes the step of:
      fixedly mounting ends of the second wrapping sections to the mounting plate.

23. The method of claim 22, wherein the first and second wrapping sections are separated by folding lines, and the wrapping step includes the step of:
   folding the wrapping member along the folding lines to wrap around the electronic device.

\* \* \* \* \*